United States Patent [19]
Kiyanagi et al.

[11] Patent Number: 5,594,389
[45] Date of Patent: Jan. 14, 1997

[54] CARRIER REGENERATION CIRCUIT INCLUDING AREA JUDGING DEVICE

[75] Inventors: Hiroyuki Kiyanagi, Sendai; Takanori Iwamatsu, Kawasaki, both of Japan

[73] Assignee: Fujitsu Limited, Kanagawa, Japan

[21] Appl. No.: 565,732

[22] Filed: Nov. 30, 1995

[30] Foreign Application Priority Data

Mar. 20, 1995 [JP] Japan .................... 7-060713

[51] Int. Cl.[6] .............................. H03L 7/085; H04L 27/38
[52] U.S. Cl. ........................ 331/12; 331/17; 329/309; 375/326; 375/327; 375/376
[58] Field of Search ................................ 331/11, 12, 17; 329/308, 309; 375/327, 326, 376

[56] References Cited

U.S. PATENT DOCUMENTS

| | | | |
|---|---|---|---|
| 4,571,550 | 2/1986 | Head | 329/309 |
| 4,574,246 | 3/1986 | Yoshida | 329/309 |
| 5,519,733 | 5/1996 | Huang | 375/326 |

*Primary Examiner*—Siegfried H. Grimm

[57] ABSTRACT

A carrier regeneration circuit achieves quick frequency synchronization without using a sweeper. An area judging device judges whether a baseband signal, quadrature-demodulated with a regenerated carrier output from a voltage-controlled oscillator, lies inside a designated area in a phase plane. If it is inside the designated area, an output of a phase comparator is selected, and if it has exited the area, the previous value is held. The designated area is set so that the direction of control indicated by the phase comparator, just before the baseband signal rotating in the phase plane exits the area, coincides with a direction that suppresses the rotation.

4 Claims, 9 Drawing Sheets

CARRIER REGENERATION CIRCUIT INCLUDING AREA JUDGING DEVICE

BACKGROUND OF THE INVENTION

1. Field of the Invention

The present invention relates to a carrier regeneration circuit used in a communications system that performs data transmission involving demodulating quadrature amplitude-modulated waves.

In demodulators used in such communications systems, the received signal is demodulated, to recover digital data, using a regenerated carrier synchronized to the phase of the carrier contained in the received signal. When a momentary break occurs in a radio communication line, for example, the carriers are thrown out of synchronization between the transmitting and receiving ends. Furthermore, a carrier frequency difference occurs between the transmitter and receiver. When the line is restored from the momentary break, the regenerated carrier must be instantly brought back into synchronization. The need therefore arises for a carrier regeneration circuit that has a wide capture range and that achieves quick synchronization.

2. Description of the Related Art

FIG. 1 is a block diagram showing an example of a receiver circuit at the receiving end in a digital multiplexing radio communication system, according to the prior art. Mixers 10 and 12 and a 90° hybrid 14 constitute a known quadrature demodulator in which an IF signal is quadrature-demodulated by the output of a voltage-controlled oscillator 16, thereby recovering baseband signals consisting of an I-phase signal and a Q-phase signal. The I-phase and Q-phase signals are respectively amplified by amplifiers 18 and 20 to a constant amplitude, and discriminated by A/D converters 22 and 24. A phase comparator 26 outputs two-bit phase error signals so that the positions of the baseband signals are brought into coincidence with prescribed signal points (in 64-QAM, they are arranged as 64 lattice points, 8 points horizontally and 8 points vertically) in a phase plane with the amplitude of the I-phase signal plotted along the horizonal axis and the amplitude of the Q-phase signal along the vertical axis. The two-bit phase error signals output from the phase comparator 26 are input to a differential amplifier 28 which obtains the difference between them and outputs a signal of one of three levels, +, −, or 0. This signal is low-pass filtered through a loop filter 38 and then input as a control signal to the voltage-controlled oscillator 16. A sweeper 40 will be described later.

FIG. 2 shows an example of the configuration of the phase comparator 26. As shown in FIG. 2, the phase comparator 26 consists of two EOR circuits 42 and 44. The most significant bit (MSB) of the Q-phase signal and the high-order error bit of the I-phase signal are input to the EOR circuit 42, while the MSB of the I-phase signal and the high-order error bit of the Q-phase signal are input to the other EOR circuit 44. The outputs of the EOR circuits 42 and 44 are coupled to the two inputs of the differential amplifier 28 whose output, therefore, is "0" when the outputs of the EOR circuits 42 and 44 are (1, 1) or (0, 0), "−" when (1, 0), and "+" when (0, 1).

FIG. 3 shows, by taking 16-QAM as an example, the 16 signal points (marked x) in the phase plane and the range of the baseband signal value when the output of the differential amplifier 28 is +, −, and 0. For example, when the baseband signal value is at point A in FIG. 3, the I-phase and Q-phase signals are both positive, so that their MSBs are both "1". Further, since point A is to the right of signal point B and to the left of the midpoint between signal points B and C, the high-order error bit of the I-phase signal is "1". Moreover, since point A is below signal point B and above the midpoint between signal points B and D, the high-order error bit of the Q-phase signal is "0". As a result, the output of the EOR circuit 42 is "0" and the output of the EOR circuit 44 is "1", so that the output of the differential amplifier 28 is "+". Therefore, when the baseband signal is at point A in the phase plane, a control signal is supplied to the voltage-controlled oscillator 16 (FIG. 1) to rotate the baseband signal in the counterclockwise direction (+ direction) closer to point B.

FIG. 4 shows the output voltage of the differential amplifier 28 as a function of the phase difference between the local oscillation signal (the output of the voltage-controlled oscillator 16) and the carrier signal contained in the input IF signal. In the above description, it is assumed that the output of the differential amplifier 28 can take only three values, +, −, and 0, but in practice, the output is a continuous value as shown in FIG. 4, since it is averaged by the time constant of the differential amplifier 28.

When a radio communication line is restored from a momentary break, the frequency of the carrier at the transmitting end (the carrier contained in the received signal) and the frequency of the carrier at the receiving end (the locally oscillated signal) usually are not identical with each other; as a result, the baseband signal rotates about the origin in the phase plane in FIG. 3. If this is plotted in FIG. 4, it is seen that the phase error, starting at 0, cycles through +10, +20, +30, +45 (same as −45), −30, −10, and 0. When this voltage is integrated in the loop filter 30, the output is near the center voltage. That is, when there is a frequency difference, the VCO 16 oscillates at the center frequency. This means that once the oscillation frequency of the VCO 16 is unlocked from the reference carrier frequency at the transmitting end, phase lock can never be restored.

To cope with this situation, the sweeper 40 shown in FIG. 1 was used in the prior art. For example, synchronization is detected using a frame synchronizing circuit at a subsequent stage, and if an out-of-synchronization condition due to a momentary break or other cause is detected, the sweeper 40 is activated and the frequency of the VCO 16 is slowly swept over the entire capture range. When frequency synchronization is achieved during sweeping, the sweeper 40 is stopped, and the usual phase lock operation is resumed.

In the prior art carrier regeneration circuit using such a sweeper, the time required to synchronize after the line is restored from a momentary break, is dependent on the sweeper speed. Usually, a sweeper operates with a cycle of several hundred milliseconds to several seconds. Therefore, it takes at least several hundred milliseconds to restore synchronization.

SUMMARY OF THE INVENTION

It is accordingly an object of the present invention to provide a carrier regeneration circuit that can quickly achieve frequency synchronization without using a sweeper.

According to the present invention, there is provided a carrier regeneration circuit comprising: a voltage-controlled oscillator for outputting a regenerated carrier; a phase comparator for determining and outputting an error signal in accordance with the position in a phase plane of a baseband signal obtained by quadrature demodulating an input signal with the regenerated carrier, the error signal being output to control the voltage-controlled oscillator so that the baseband signal can be brought into coincidence with any one of a plurality of predetermined signal points in the phase plane; a loop filter for removing high-frequency components of the error signal output from the phase comparator and for supplying the thus filtered output as a control signal to the voltage-controlled oscillator; an area judging device for outputting an area judging signal indicating whether the baseband signal lies inside a designated area in the phase plane, the designated area being set so that the direction of control indicated by the output of the phase comparator, just before the baseband signal rotating in the phase plane exits the area, is opposite to the direction of rotation of the baseband signal; and holding circuits for holding, when the area judging signal indicates that the baseband signal has exited the designated area, the immediately preceding output of the phase comparator until the baseband signal reenters the area.

When the frequency of the carrier contained in the input signal is not identical with the frequency of the regenerated carrier, the baseband signal rotates in the counterclockwise direction (+ direction) or in the clockwise direction (− direction) in the phase plane. When the baseband signal exits the designated area, the holding circuits hold the immediately preceding control value. Since the area is set so that the control value is opposite to the direction of rotation of the baseband signal, the value indicating a direction that suppresses the rotation is held until the baseband signal enters the next area. As a result, since the time average value is displaced from the center value toward a value of such a direction as to suppress the rotation, frequency synchronization is quickly achieved.

DESCRIPTION OF THE PREFERRED EMBODIMENTS

Figure 1:
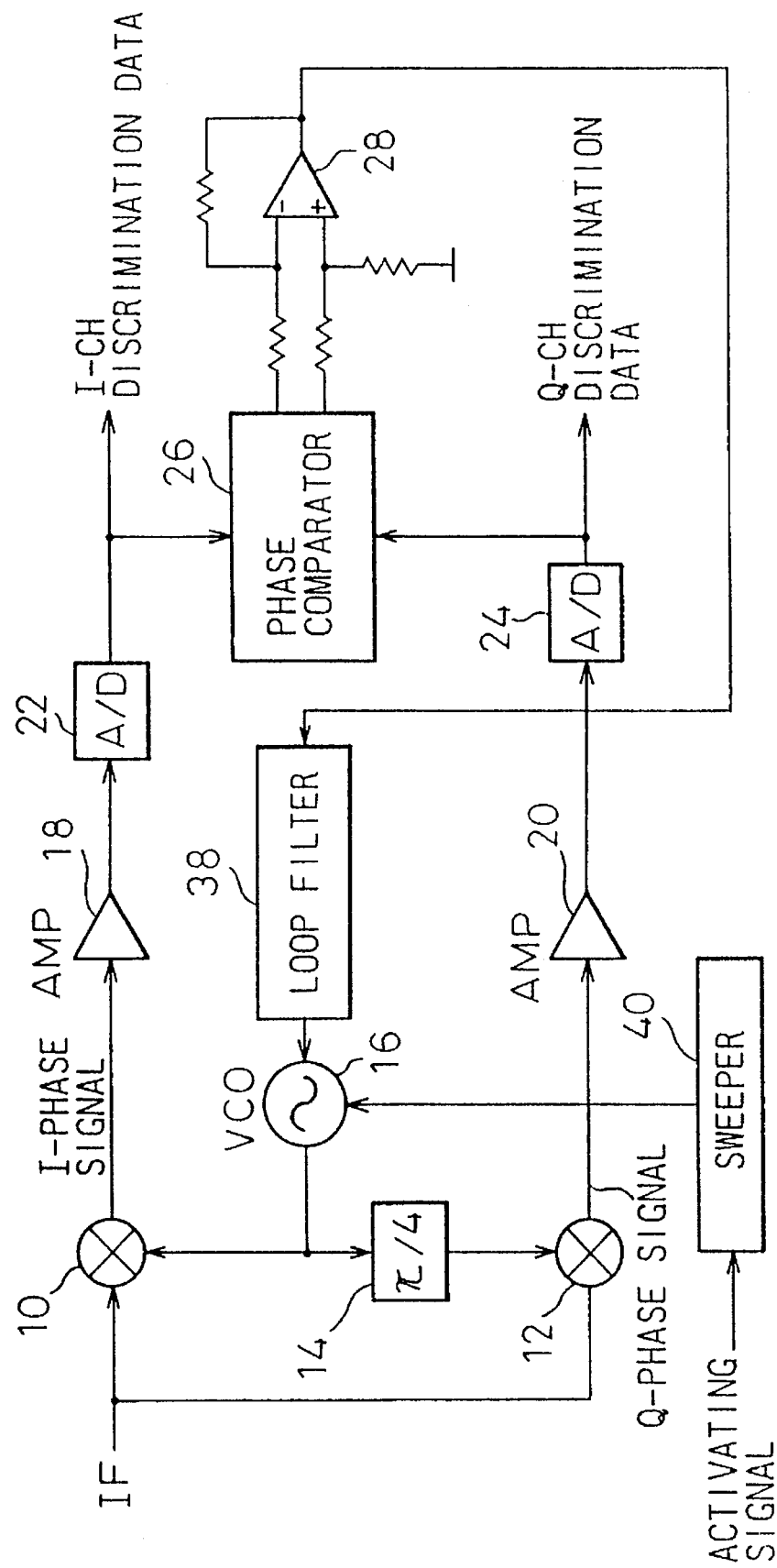
FIG. 1 is a block diagram showing the configuration of a receiver circuit containing a carrier regeneration circuit of the prior art.
Figure 5:
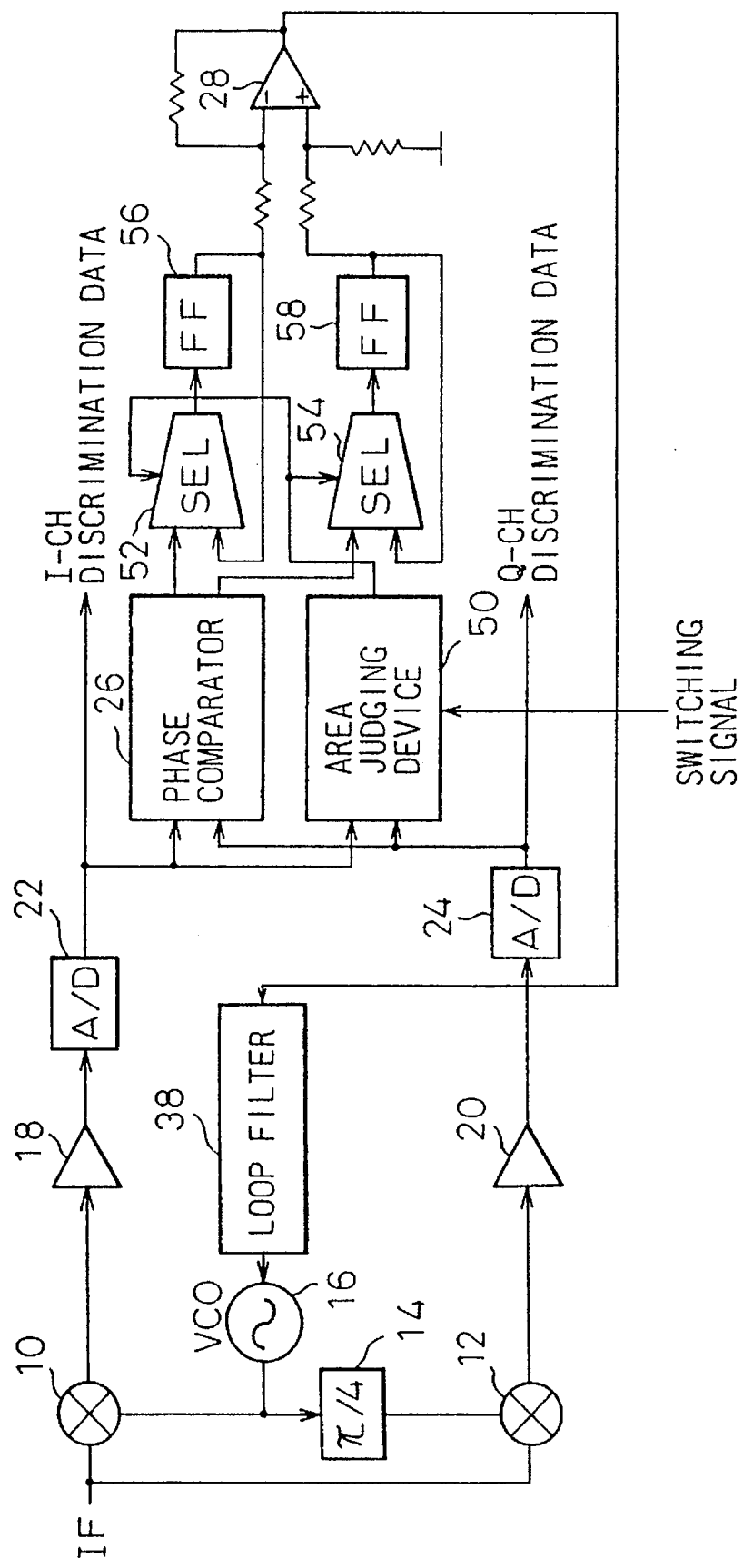
FIG. 5 is a block diagram showing the configuration of a receiver circuit containing a carrier regeneration circuit according to the present invention.

FIG. 5 shows the configuration of a receiver circuit at the receiving end in a digital multiplexing radio communication system, containing a carrier regeneration circuit according to one embodiment of the present invention. The same constituent parts as those shown in FIG. 1 are designated by the same reference numerals, and explanation of such parts is not repeated here.

An area judging device 50 judges whether or not the baseband signal lies inside a designated area in the phase plane, based on I—CH discrimination data fed from the A/D converter 22 and Q—CH discrimination data fed from the A/D converter 24, and outputs a signal to cause selectors 52 and 54 to select the output of the phase comparator 26 if the baseband signal is inside the designated area, and to select the outputs of flip-flops 56 and 58, respectively, if it is outside the designated area. The flip-flops 56 and 58 respectively latch the outputs of the selectors 52 and 54 in synchronism with master clock, and supply them to the differential amplifier 28.

Figure 3:
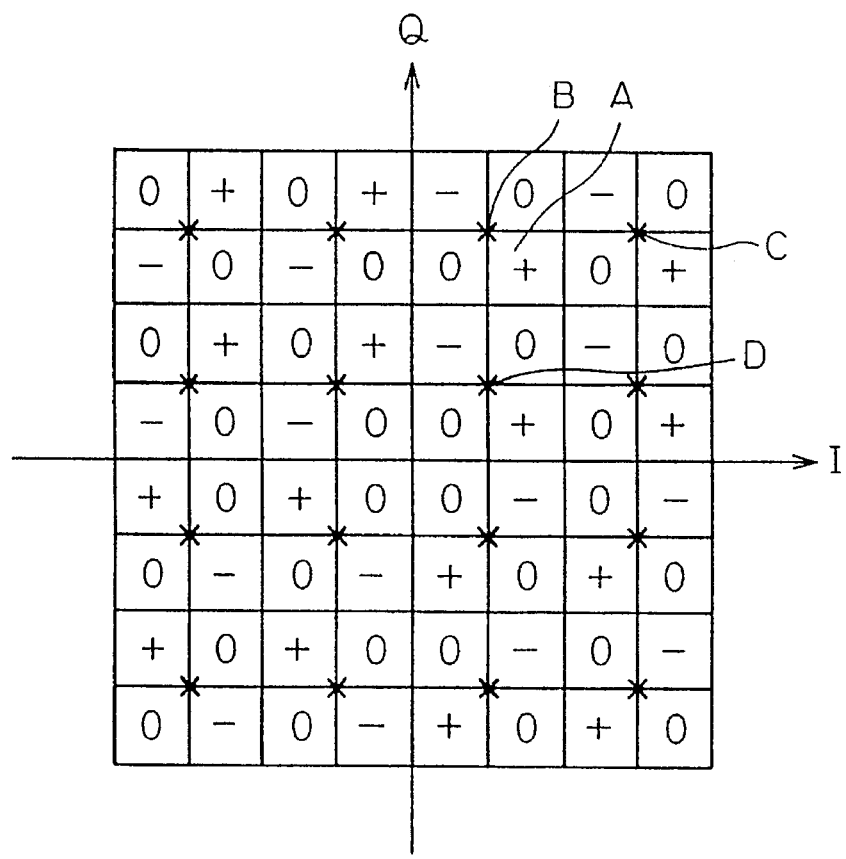
FIG. 3 is a diagram for explaining the operation of the phase comparator in a phase plane.
Figure 4:
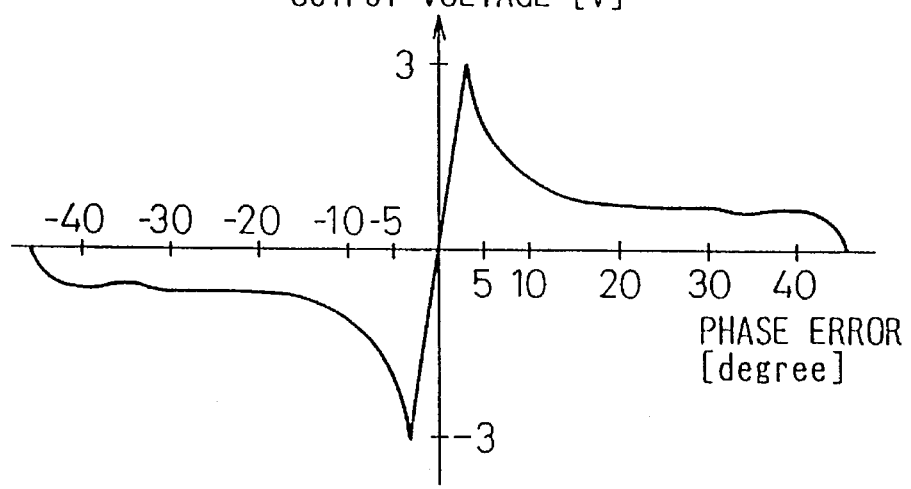
FIG. 4 is a graph showing an output characteristic of a differential amplifier 28.
Figure 6:
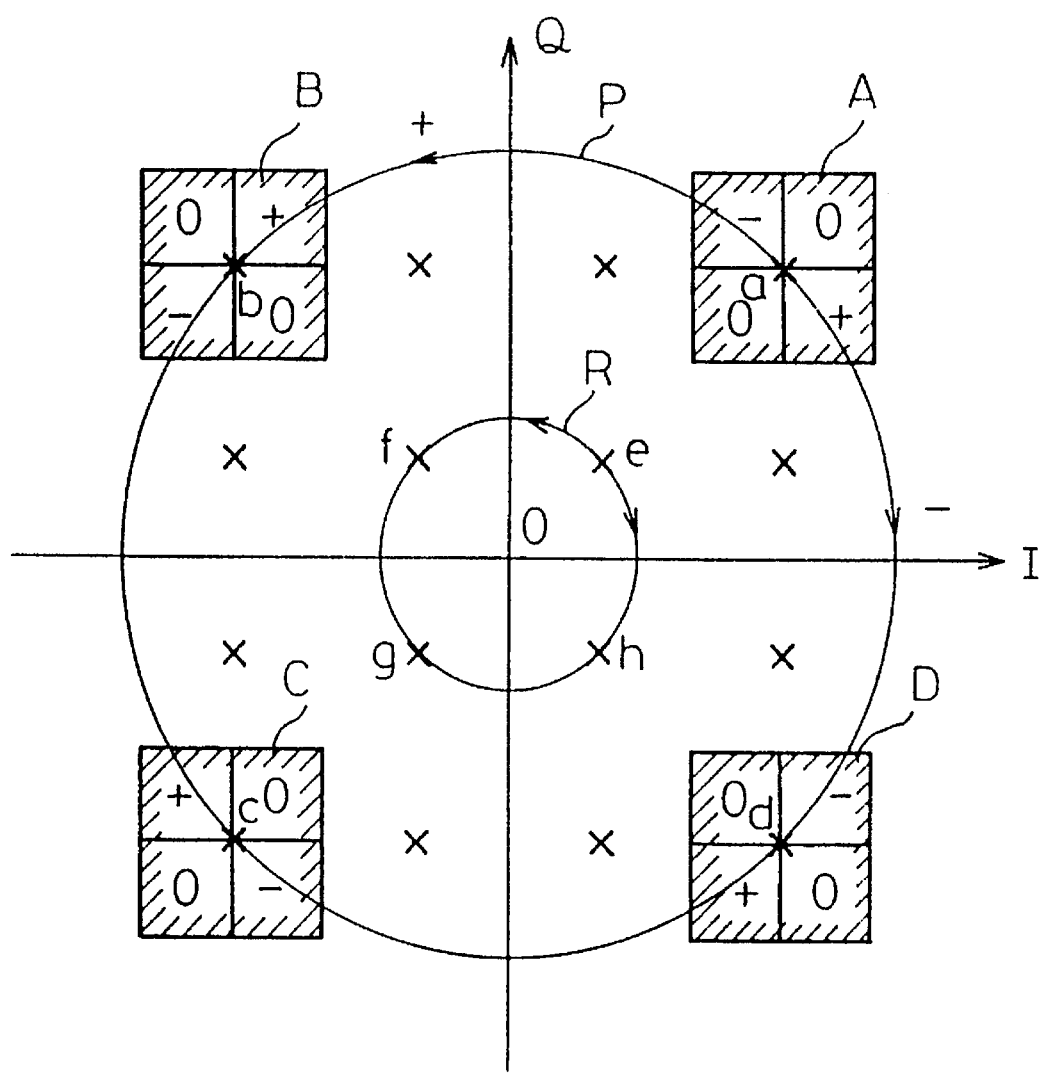
FIG. 6 is a diagram for explaining the operation of an area judging device in a phase plane.

The judging areas of the area judging device 50 are set in the phase plane, for example, as shown in FIG. 6 by A to D near the four outermost points a, b, c, and d out of the 16 signal points in the case of 16-QAM. Shown in each area are the control values explained with reference to FIG. 3.

When signals at baseband are rotating in the counterclockwise direction (+ direction), any signal expected to rest on one of the signal points, a, b, c, or d, rotates in the + direction on a circle P having its center at the origin O and passing through the signal points a, b, c, and d. In this case, the control value just before the signal exits any of the areas, A, B, C, or D, is always negative, so that outside the areas a negative value is latched ("1" and "0" are latched in the flip-flops 56 and 58, respectively, and the output of the differential amplifier is "−"). Further, when a signal is rotating in a circle R passing through signal points e, f, g, and h, since the value when the signal last exited any of the areas is held, the control value remains negative. Conversely, when a signal is rotating in the − direction, the control value just before the signal exits any of the areas is positive; therefore, outside the areas, a positive value is held.

Figure 7:
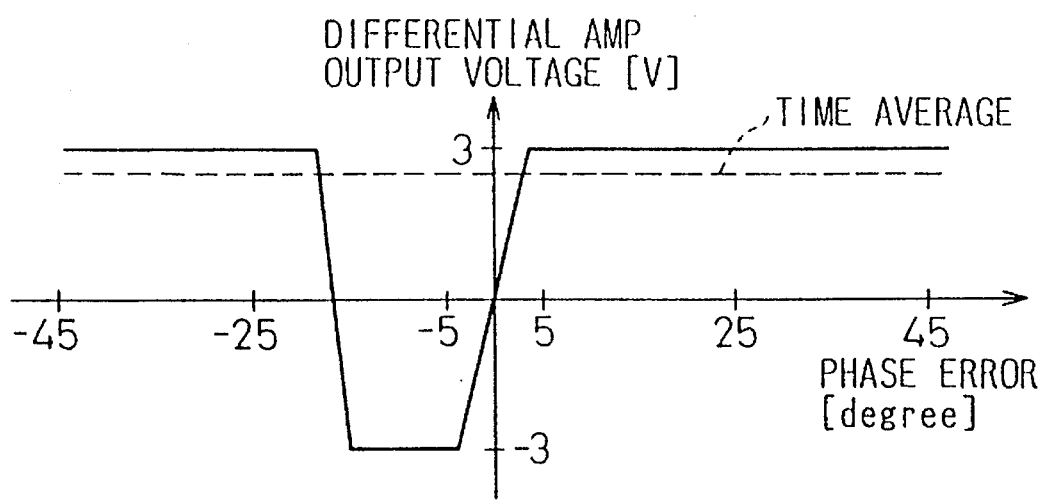
FIG. 7 is a graph showing an output characteristic of a differential amplifier when a baseband signal is rotating in the clockwise direction.
Figure 8:
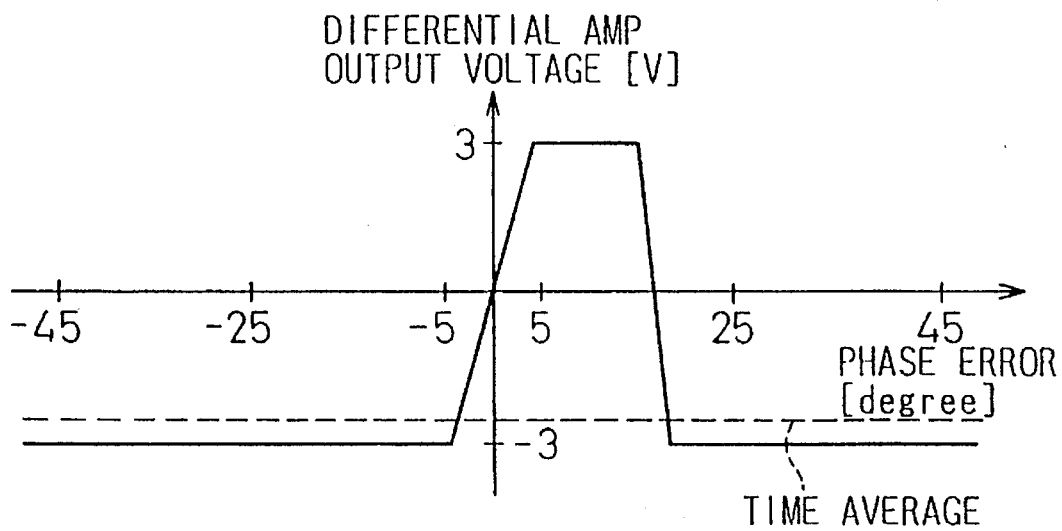
FIG. 8 is a graph showing an output characteristic of the differential amplifier when a baseband signal is rotating in the counterclockwise direction.

FIG. 7 shows the output characteristic of the differential amplifier 28 when the signal is rotating in the − direction on the circle P. As shown in FIG. 7, inside the areas a negative value can appear, but outside the areas the value is always positive; if the output is time-averaged (low-pass filtered) by the loop filter 38, a positive value is obtained as shown by the dashed line in FIG. 7, thus suppressing the rotation. When the signal is rotating in the + direction on the circle P, inside the areas a positive value can appear, but outside the areas the value is always negative, as shown in FIG. 8. When low-pass filtered by the loop filter 38, the output shows a negative value as indicated by the dashed line in FIG. 8, thus suppressing the rotation. When the received carrier and the regenerated carrier are brought into phase and frame synchronization is established by the frame synchronizing circuit at the subsequent stage, the output of the area judging device is driven low by a switching signal (FIG. 5), and the operation enters the usual phase lock mode.

Figure 2:
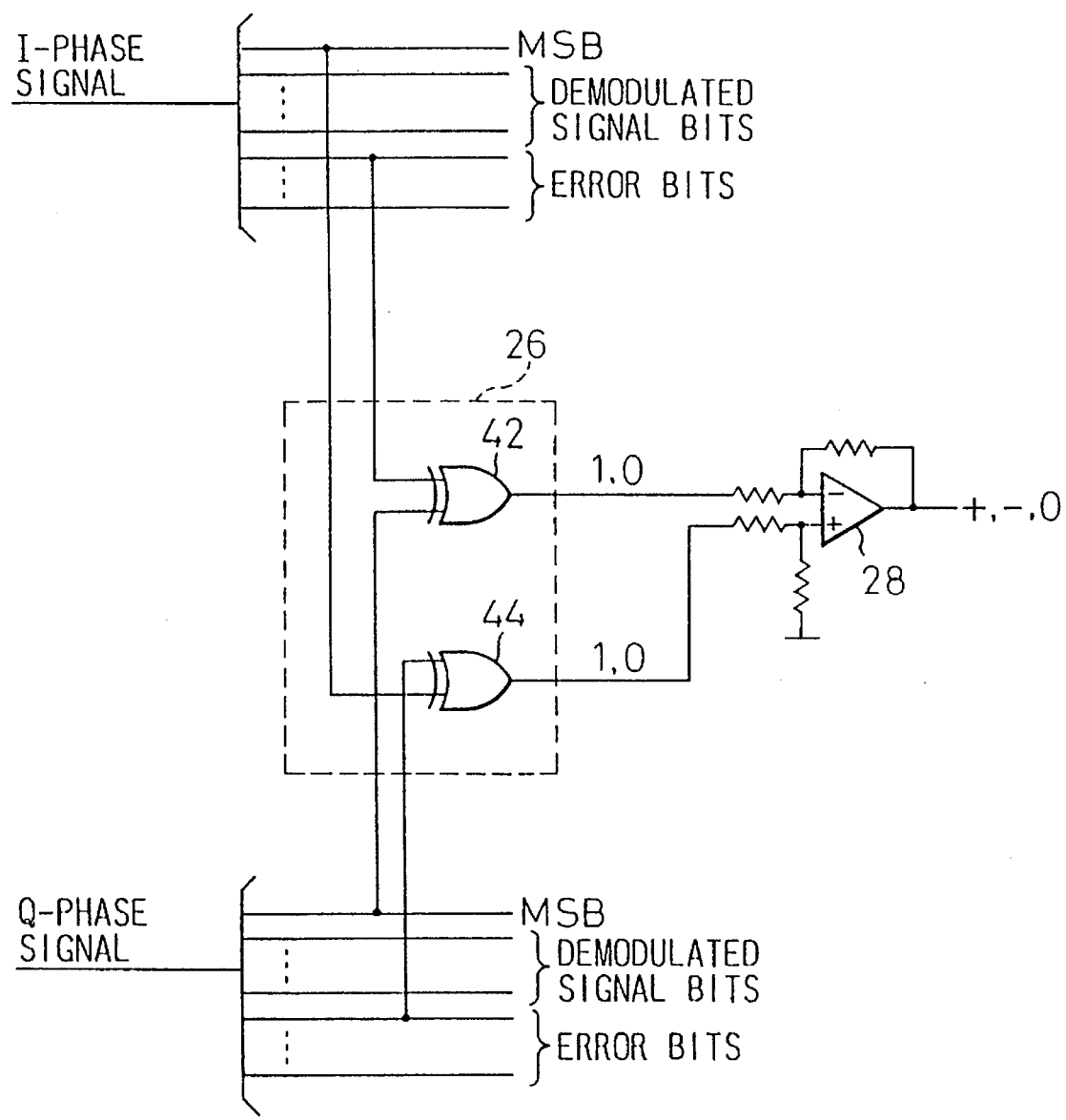
FIG. 2 is a circuit diagram showing an example of the configuration of a phase comparator 26 in FIG. 1.
Figure 9:
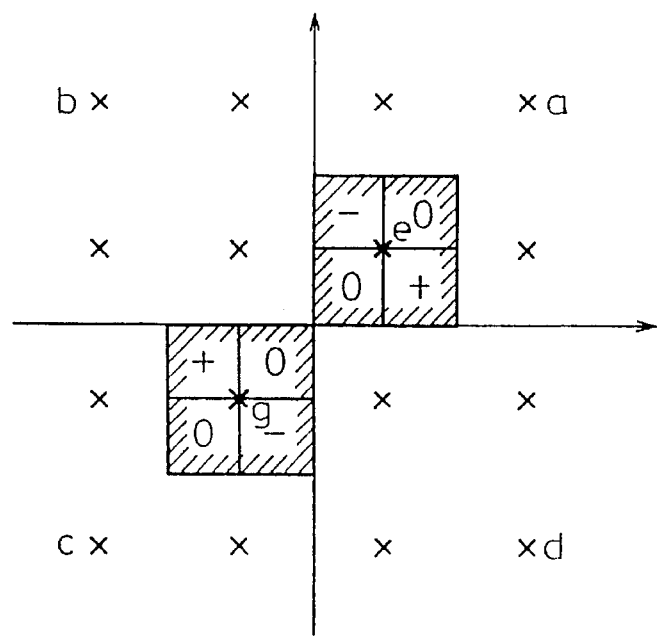
FIG. 9 is a diagram showing another example of the operation of the area judging device.
Figure 10:
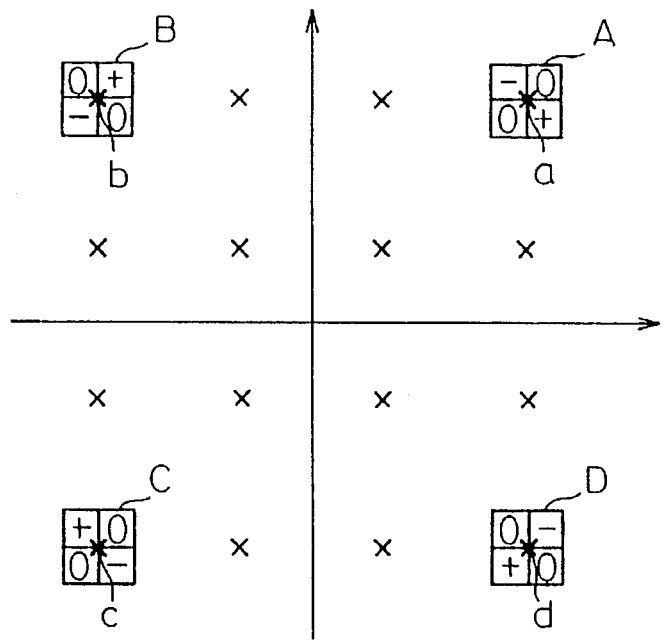
FIG. 10 is a diagram showing still another example of the operation of the area judging device.

The judging areas need not necessarily be set near the four outermost signal points a, b, c, and d. Instead, the areas may be set near the signal points e and g, as shown in FIG. 9. It is also possible to set the areas near the signal points a, b, c, d, e, and g, for example. Moreover, as shown in FIG. 10, the areas A, B, C, and D may be made even smaller, with their centers at the respective signal points a, b, c, and d, by using the high-order two bits of the error bits (see FIG. 2).

Figure 11:
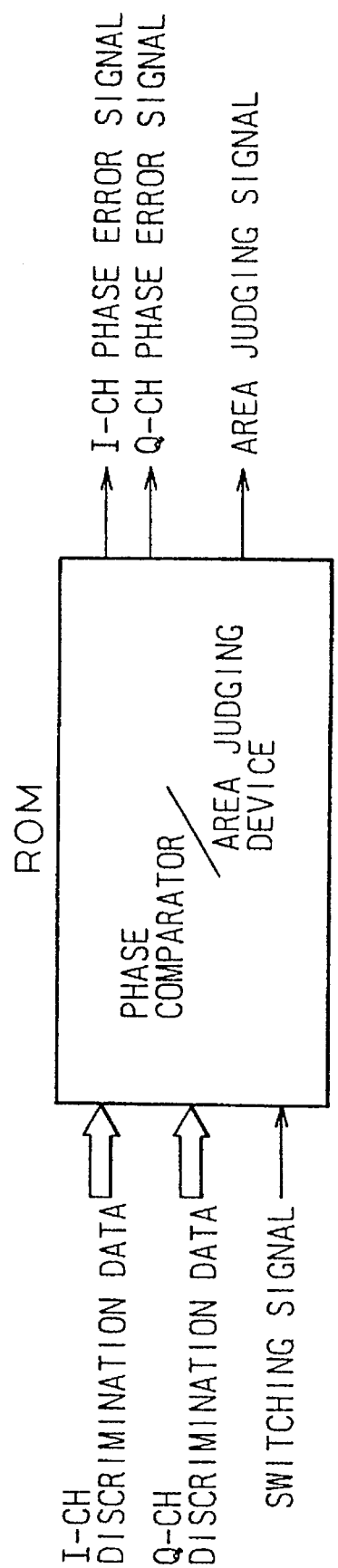
FIG. 11 is a diagram showing an implementation of the phase comparator and area judging device.
Figure 12:
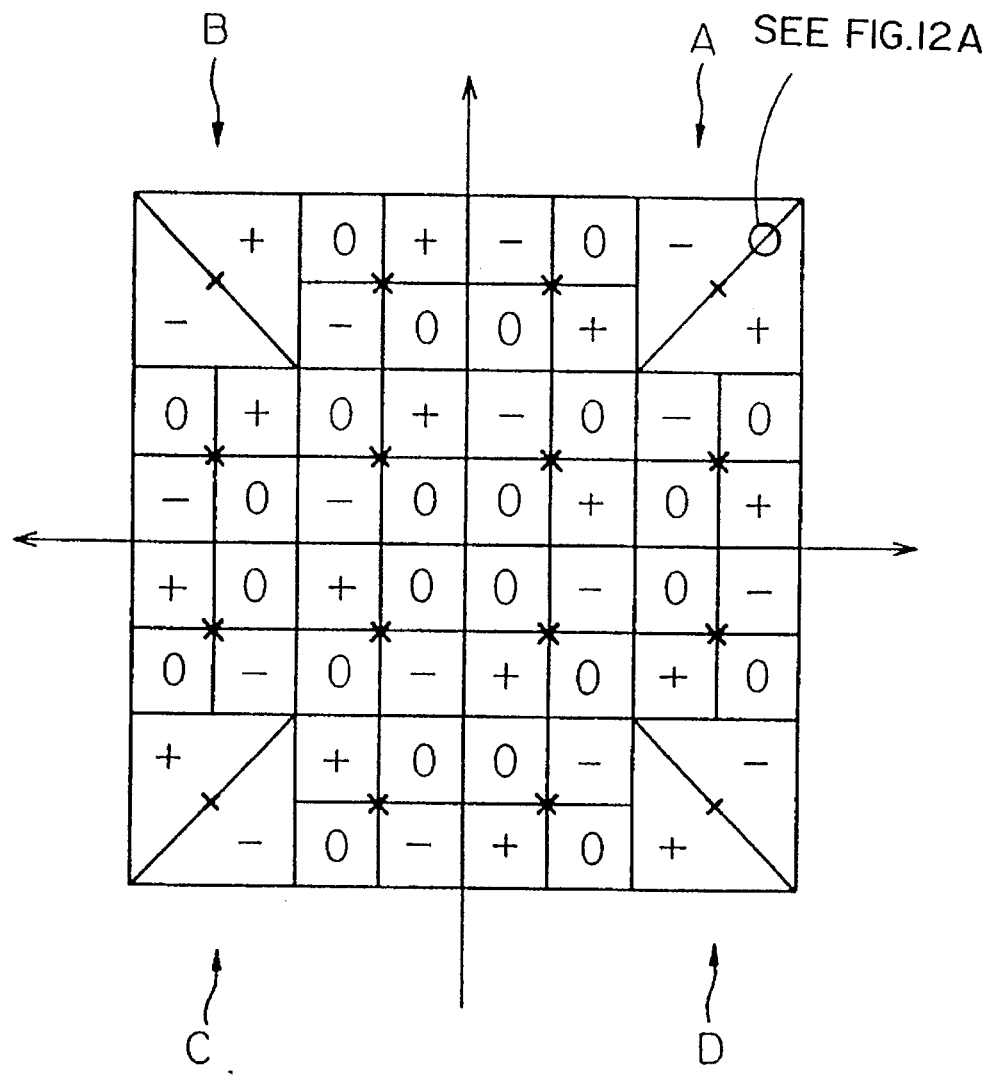
FIG. 12 is a diagram showing another example of the operation of the phase comparator and the area judging device.
Figure 12A:
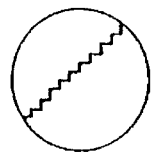

The phase comparator 26 and the area judging device 50 can be implemented on a single read-only memory (ROM), as shown in FIG. 11. In this case, as shown in FIG. 12, in the areas A, B, C, and D, the boundary that determines the output of the phase comparator may be set diagonally (more properly, in a stepwise manner).

We claim:

1. A carrier regeneration circuit comprising:

a voltage-controlled oscillator for outputting a regenerated carrier;

a phase comparator for determining and outputting an error signal in accordance with the position in a phase plane of a baseband signal obtained by quadrature demodulating an input signal with the regenerated carrier, the error signal being output to control the voltage-controlled oscillator so that the baseband signal can be brought into coincidence with any one of a plurality of predetermined signal points in the phase plane;

a loop filter for removing high-frequency components of the error signal output from the phase comparator and for supplying the thus filtered output as a control signal to the voltage-controlled oscillator;

an area judging device for outputting an area judging signal indicating whether the baseband signal lies inside a designated area in the phase plane, the designated area being set so that the direction of control indicated by the output of the phase comparator, just before the baseband signal rotating in the phase plane exits the area, is opposite to the direction of rotation of the baseband signal; and holding circuits for holding, when the area judging signal indicates that the baseband signal has exited the designated area, the immediately preceding output of the phase comparator until the baseband signal reenters the area.

2. A circuit according to claim 1, wherein the designated area is in the vicinity of some of the signal points.

3. A circuit according to claim 1, wherein the holding operation of the holding circuits is prohibited once the baseband signal is pulled into synchronizm.

4. A circuit according to claim 1, wherein the phase comparator and the area judging device are implemented on a single memory that outputs the error signal and the area judging signal by giving a baseband signal value as an address.

* * * * *